United States Patent [19]

Miksche

[11] Patent Number: 4,796,159
[45] Date of Patent: Jan. 3, 1989

[54] EXPLOSION PROTECTED MODULAR HOUSING

[75] Inventor: Detlev Miksche, Niedernhall, Fed. Rep. of Germany

[73] Assignee: R. Stahl Schalteräte GmbH, Kunzelsau, Fed. Rep. of Germany

[21] Appl. No.: 95,561

[22] Filed: Sep. 10, 1987

[30] Foreign Application Priority Data

Sep. 26, 1986 [DE] Fed. Rep. of Germany ....... 3632676

[51] Int. Cl.⁴ ............................................. H02B 1/04
[52] U.S. Cl. ...................................... 361/429; 174/50; 361/393; 361/415; 439/64; 439/79
[58] Field of Search ................. 439/50, 62, 64, 76, 439/78, 79; 174/52 PE, 52 S, 50, 77 R, 22 R, 23 R; 361/356, 357, 380, 390, 391, 393, 394, 395, 399, 413, 415, 426, 429

[56] References Cited

U.S. PATENT DOCUMENTS

| | | | |
|---|---|---|---|
| 3,904,812 | 9/1975 | Daffron | 361/395 |
| 4,213,018 | 6/1980 | Piston | 174/50 |
| 4,216,349 | 8/1980 | Wium | 174/50 |
| 4,229,403 | 10/1980 | Guleserian | 174/52 PE |
| 4,399,485 | 8/1983 | Newmann | 361/395 |
| 4,510,553 | 4/1985 | Faultersack | 361/413 |
| 4,591,949 | 5/1986 | Lahr | 361/380 |
| 4,664,281 | 5/1987 | Falk | 174/50 |
| 4,672,511 | 6/1987 | Meusel | 361/380 |

OTHER PUBLICATIONS

Siemens MP 29–1984 "Feldmultiplexer FM 100".

Primary Examiner—G. P. Tolin
Attorney, Agent, or Firm—Frishauf, Holtz, Goodman & Woodward

[57] ABSTRACT

An explosion-protected modular housing (3) for electrical and/or electronic components (29) includes at least one sand-filled chamber (28), in which the components are housed. The components (29) are protected in this manner in the safety mode known as "sand filling". Also provided on the housing (3) are connection devices (6, 7) for supply lines to the housing. To enable insertion or removal of a selected housing from a holder (2) at any time without shutting off the entire system of which the selected housing (3) is a part, the connection devices (5, 7) are part of a complementary two-part plug-and-receptacle arrangement (4), which is flame-proof. One part (6) of the arrangement is connected electrically with the components (29) in the housing (3), the other part (5) to a power distribution bus. The "not intrinsically safe" circuits are connected via this plug-and-receptacle arrangement (4). Serially connected encapsulated switch means (58, 67) operated upon coupling-/uncoupling of the two parts (5, 6) prevent arcing at the plug-and-receptacle arrangement.

43 Claims, 8 Drawing Sheets

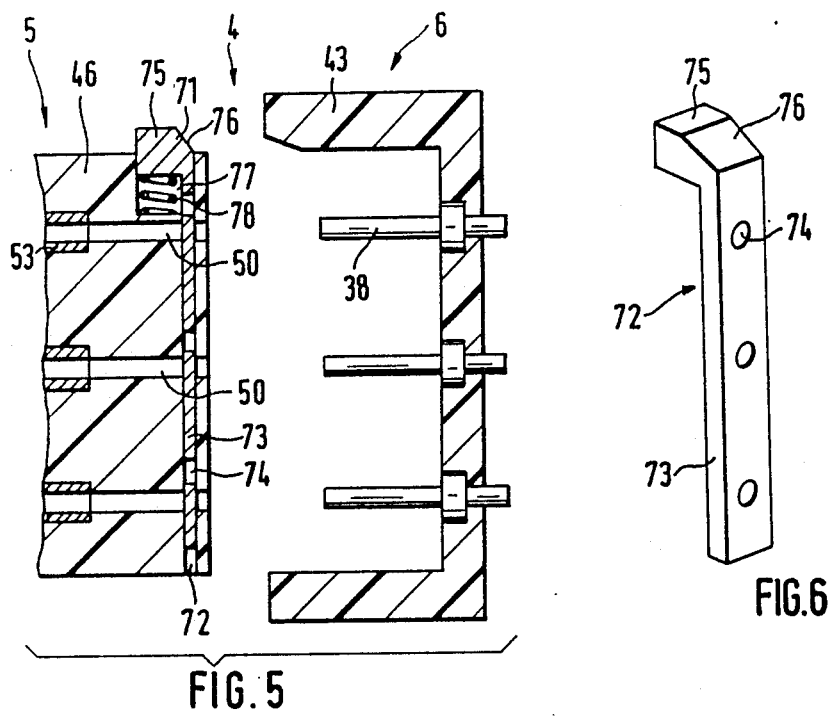
FIG. 5
FIG. 6
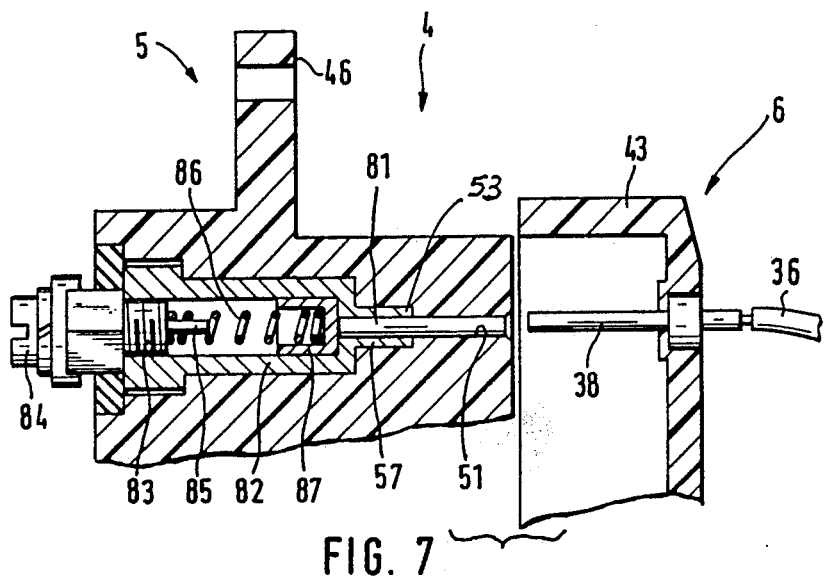
FIG. 7

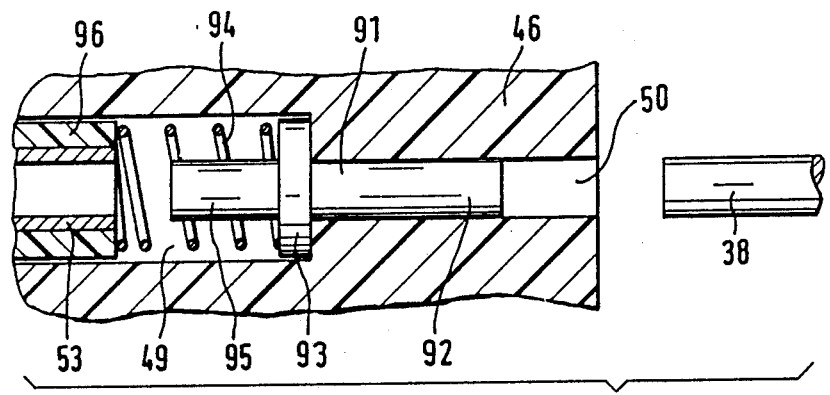
FIG. 8
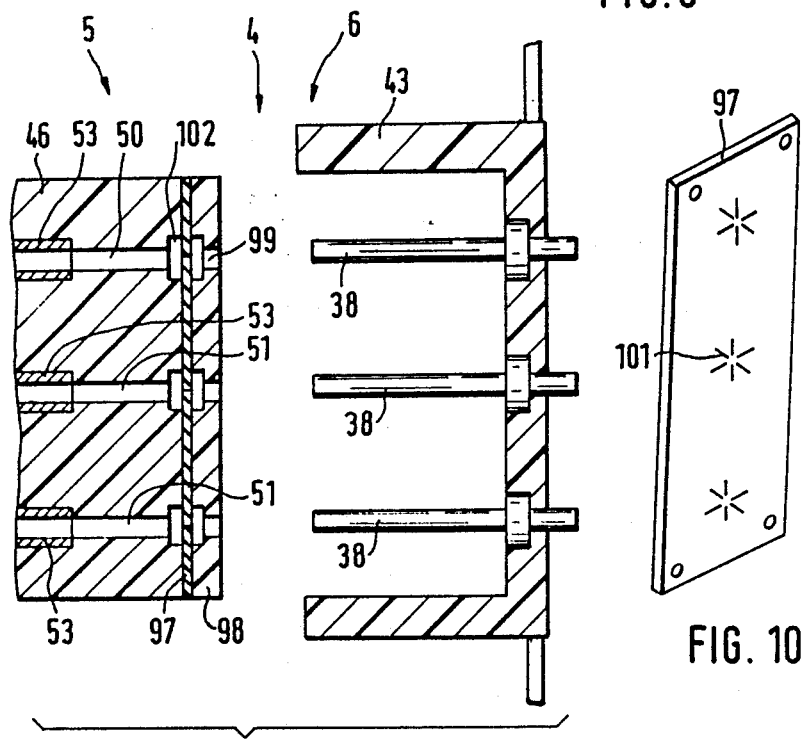
FIG. 9
FIG. 10

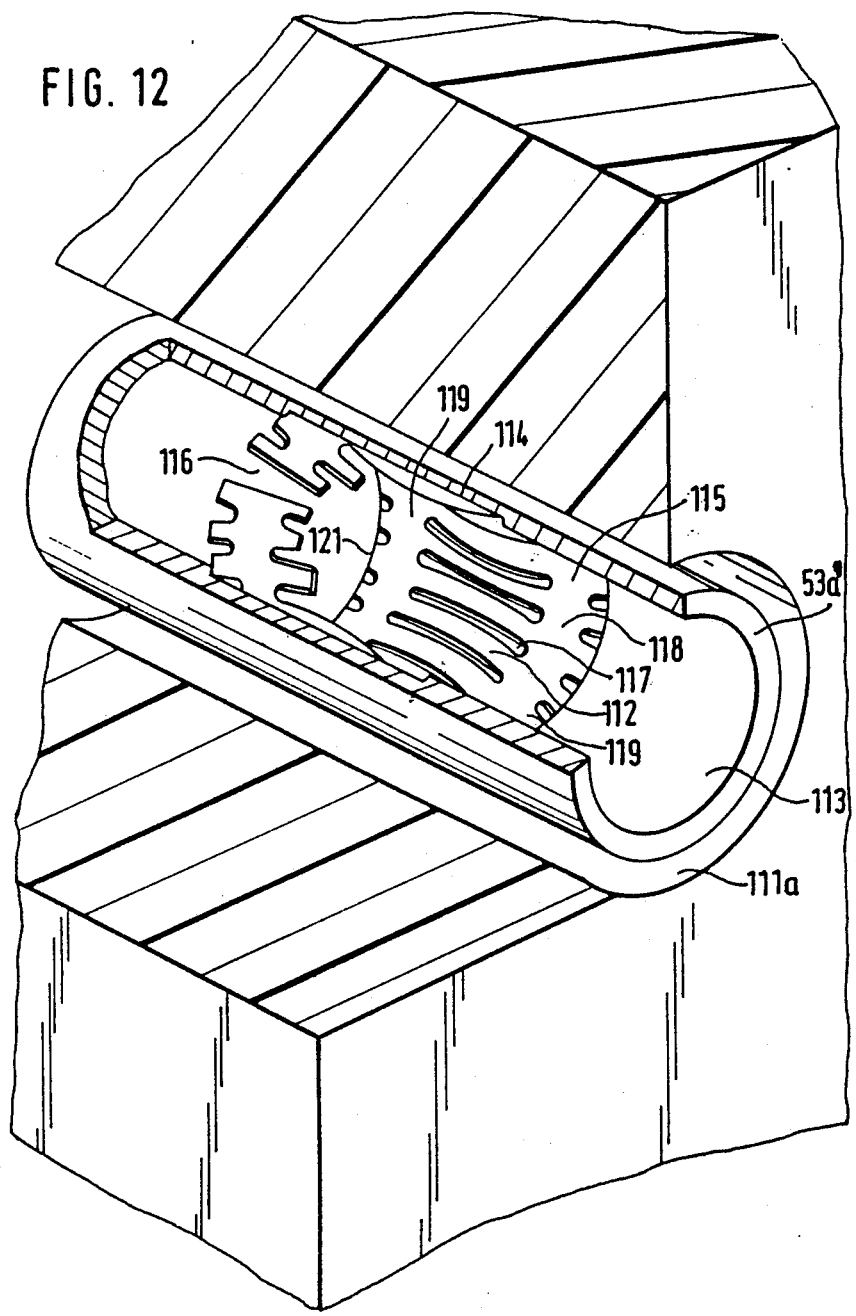

EXPLOSION PROTECTED MODULAR HOUSING

The present invention relates to a modular housing and connection system to permit connection to be made to explosion-protected electrical or electronic subsystems, retained within explosion-proof, e.g. flameproof or sandfilled housings, and more particularly to a connection arrangement in which permanent connection of electric power to the explosion protected subsystem is effected through screw-less plug-and-receptacle connection elements so that the connection, in turn, are explosion-protected.

BACKGROUND

It is frequently necessary to provide power supplies to explosion-protected electrical subsystems, and particularly to such electrical subsystems which are retained within a flame-proof, or explosion-proof housing. If electrical signals are to be transmitted, that is, electrical energy at voltage and current levels which are so low that no sparking, capable of causing ignition, may occur upon connection or disconnection, or the like, or which are so low that no appreciable heating of components results, ordinary inherently non-explosion-protected connections may be used. Such connections are termed "intrinsically safe" connections. If considerable energy, however, is to be transferred, connection or disconnection of a power supply to the explosion-protected subsystems may require transfer of voltage and/or current levels which are high enough to be dangerous if the connection arrangement is located in a hazardous area. Connections then must meet the standard "flameproof enclosures" of IEC 79-1, to which ANSI C 33-30 an C 33-27 correspond.

Reference in the application will be made hereinafter to various safety standards. These standards are promulgated by the International Electrotechnical Commission (IEC) of which the U.S. is a party; local are promulgated by the Fire Underwriters Laboratory (UL), the National Electric Code (NEC), the National Electrical Manufacturers Association (NEMA) and the American National Standard Institute (ANSI). Other standards are promulgated by the European Committee for Electrotechnical Standardization (CENELEC), headquartered in Brussels, Belgium.

The standards to which particular reference will be made in this application are contained in the basic standard IEC 79, and especially in the following:

IEC 79-1 "Flameproof Enclosures", corresponding to ANSI C33-30 and C33-27

IEC 79-2) "Pressurized Enclosures"

IEC 79-13) ANSI 106.1

IEC 79-11 "Intrinsic Safety i" ANSI 4193:

Electrical apparatus for potentially explosive atmospheres.

IEC 79-7 "Increased Safety e" No corresponding ANSI:

Electrical apparatus for potentially explosive atmospheres, increased safety.

IEC 79-5 "Sand Filling q" No corresponding ANSI

IEC publication 529 (1976) "Classification of Degrees of Protection Provided by Enclosures"

IP 54: "Protection Against Splashing Waters, Dust and the Like"; roughly equivalent to NEMA 3S.

The ANSI Standards and IEC include the following definitions:

"Intrinsically Safe Circuits 'i'" (ANSI 4193): a circuit in which any spark or thermal effect produced either in normal operating conditions or in specified fault conditions is incapable, under the test conditions specified in the relevant standard, of causing ignition of a specified explosive atmosphere.

"Increased Safety Electrical Apparatus 'e'" (IEC79-7): electrical apparatus which does not, under normal operating conditions, produce arcs, sparks or heating likely to cause ignition of the explosive atmosphere for which it is designed and in the construction of which measures have been taken to avoid, with a major degree of security, the occurence of these phenomena under normal operating conditions and recognized overload conditions.

"Flame-Proof Enclosure 'd'" (ANSI C33-27 and C33-30): an explosion-proof enclosure; a type of protection in which the parts which can ignite an explosive atmosphere and enclosed in an enclosure which can withstand the pressure developed during an internal explosion of an explosive mixture and which prevents the transmission of the explosion to the explosive atmosphere surrounding the enclosure.

"Flame-Proof Joint": a place where corresponding surfaces of the different parts of a flame-proof enclosure come together to prevent the transmission of an internal explosion to the explosive atmosphere surround the enclosure.

"Gap of a Flame-Proof Joint": the distance between the corresponding surfaces of a flame-proof joint; for a cylindrical surface, the gap is the diammetrical clearance, that is, the difference between the diameters.

"Length of Flame-Proof Joint": the length of the flame path, or the shortest path through a flame-proof joint from the inside to the outside of the flame-proof enclosure (does not apply to threaded joints).

The foregoing definitions were prepared by Technical Committee 31, "Electrical Apparatus for Explosive Atmospheres" of the IEC, and published as document 31 VEI/IEV 426 by the Secretariat of the IEC Section 123.

Explosion-protected housing for electronic subsystems or units are described in the Siemens catalog MP 29, part 10, pages 10 to 14, June 1984. This catalog describes an arrangement in which a chamber is formed by a housing. The chamber retains a circuit board with the electrical structural elements to be protected. The chamber, with the circuit board therein, is filled with stand. Electrical connections to the sand-encapsulated circuit board are formed by a connection chamber which is part of the housing, and which is constructed in accordance with the protection mode "increased-safety." It uses, for example, screw clamp connection for connection wiriting. Securely connected connection lines extend from the screw clamps into the sand filled chamber, where they are, in turn, connected to the circuit board. The pass-through to the sand filled chamber may be constructed in accordance with appropriate safety provisions, e.g., IEC Safety Provision IP 54.

This structure is inherently quite simple and has the particular advantage that the housing, because of the sand encapsulation, needs to have only slight wall thicknesses, which are much less than in housings that, with the same volume, are made in the "flame-proof encapsulation" construction. Moreover, the sand filling improves the dissipation of heat from the interior of the housing, as compared with the air filling in a flame-proof encapsulated housing. As a result, with this housing, the electronic components can be operated at a higher power loss.

However, it has been found in practice that electronic components do fail from time to time and must therefore be replaced. In the event of malfunction tracing and diagnosis as well, the particular component under observation must sometimes be disconnected from the remainder of the circuit. With the known modular housing, the subsystem or at least that part of the subsystem that contains the particular modular housing must be disconnected from voltage, before the "increased safety" connection chamber can be opened safely, in order to disconnect the supply lines in it.

In systems that contain the known modular housing, the system or corresponding part of that system must therefore be shut down for a relatively long period of time during malfunction tracing and diagnosis or malfunction clearing, because the supply of current is also shut down for the other modular housing, which actually are performing properly. Not only must those parts of the system that are connected to the same current supply as the module to be replaced be shut down, but also those parts from which or to which signal lines lead that are not considered "intrinsically safe", as defined by IEC Standard 79-11 or ANSI 4913, even though under some circumstances that system could continue to be operated at least on a limited basis even with the malfunctioning electronic component removed.

THE INVENTION

It is an object to devise an explosion protected modular housing system in which a subsystem can more simply and quickly be removed from or introduced into the system, without having, for explosion protection reasons, to shut off supply voltages for all subsystems housed in that modular housing, or to deenergize intrinsically safe signal lines.

Briefly, the connection system includes a two-part plug-in and receptacle arrangement. Plug parts and receptacle parts are complementary, that is, fit together. A first part is located on a frame, coupled to a connected cable to supply, for example, electrical energy at elevated current and/or voltage levels. The second part is located on a subsystem in a modular housing. The subsystem, for example, may be constructed as known in the form of an explosion-proof chamber which retains electrical and/or electronic components, and which can be filled with sand. The chamber is sealed.

In accordance with the invention, the parts of the plug-in and receptacle arrangement include elements of an explosion-protected flame-proof joint, forming a plug-and-receptacle connection system to provide for electrical connection, to a supply cable, and to electrical components located on the other part, that is, in the subsystem by connections which are not intrinsically safe. The first part of the flame-proof, or explosion-protected plug-and-receptacle connection system is complementary with the second part thereof. Typically, the flame-proof plug-and receptacle connection includes a bore formed in a block of insulating, e.g., plastic material, which has, in the interior and recessed from the edge portion, a connection bushing sleeve or other terminal element; the parts which are located on the explosion-protected subsystem housing include projecting terminal elements which fit into the bore, with a flame-proof joint gap, as defined by the IEC and above recited. The gap between the projecting element and the wall of the bore is so designed that no ignition particles which might ignite can escape from the gap if a connection or disconnection of the circuit causes sparking.

Typically, the first part is retained in a frame or the like.

The relationships of projecting pin and plug receptacle of course may be reversed; for simplicity, and since it is the preferred form, the drawings and claims hereinafter will refer to th pin or plug elements to be located on the explosion-protected housing portion, and the receptacle part being retained on the frame.

In accordance with a feature of the invention, and in order to prevent any arcing during change of connection condition, an explosion-protected encapsulated switch, e.g., a microswitch, is located in circuit with the pins or bushings, respectively, to disable or deenergize the circuit connection which will be broken upon severing the first or second part, for example upon removal of the explosion-protected housing from the frame. Thus, any turn-off arcs or the like would occur within the explosion-proof switch and not upon severing of the connection between the first and second parts.

Since the electrical connections, at least those that are not intrinsically safe, are provided via a flame-proof plug-in and receptacle connection arrangement, the plug-and-receptacle connection can be disconnected at any time without requiring particular electrical provisions to that end. Finally, the connection and disconnection of such a plug-and-receptacle arrangement takes place much more quickly than does the opening and reconnection of screwed electrical connections. Even if the system must be shut down for whatever reasons in order to remove the modular housing with the component that is to be replaced, the down time is much shorter than in the case of screwed connections.

In this way it becomes possible, even in hazardous areas, to use plug-in connections for components, i.e., an arrangement that is already typical in nonprotected areas and that has stood the test of time. With the known modular housings that have the "increased safety" connection chamber, this plug-in technology cannot be attained, even if a plurality of the connections are intrinsically safe and can be provided via a standard terminal strip with receptacles and blades or pins, e.g., of the type used with printed circuit boards (see ANSI S815A) or the like. In the novel modular system with subsystems, however, such plug-in or receptacle strips can suitably be used with the flame-proof plug-and-receptacle arrangement, intrinsically safe connections, e.g. low power, low voltage signal line connections to and from the modular housing can be made via the terminal strips and plug connections that are available on the market.

For retaining the modular subsystem housings, guide elements that extend parallel to and spaced apart from one another are suitably provided.

DRAWINGS

FIG. 1, in a perspective view partially in section and cut away, shows a component assembly holder according to the invention, having an explosion-protected modular subsystem housing according to the invention;

FIG. 2, in a plan view with the top wall removed, shows the explosion-protected modular subsystem housing of FIG. 1;

FIG. 3 shows the explosion-protected modular subsystem housing of the FIG. 1 with the side wall removed and with the partially cut-away portion of the explosion-protected plug part of a plug-and-receptacle arrangement retained on the subsystem housing;

FIG. 4, in a perspective exploded view showing the interior structure, shows the explosion-protected plug-and-receptacle arrangement that is used in both the component assembly holder and the explosion-protected modular subsystem housing of FIG. 1;

FIG. 4A shows the equivalent electrical circuit of the system of FIG. 4;

FIG. 5, in a schematic sectional side view, shows a further exemplary embodiment of the explosion-protected plug-and-receptacle arrangement for the component assembly holder and explosion-protected modular subsystem housing of FIG. 1, in which the bores for the receptacles are closable by means of a slider;

FIG. 6, in a perspective view, shows the slider of the explosion-protected plug-and-receptacle arrangement of FIG. 5;

FIG. 7, in a schematic sectional side view, shows an explosion-protected plug-and-receptacle arrangement for the explosion-protected modular subsystem housing and component assembly holder of FIG. 1, in which the bore for the receptacle is closable by means of a pin of electrically nonconductive material;

FIG. 8, in a highly schematic sectional side view, shows a explosion-protected plug-in arrangement for the explosion-protected modular subsystem housing and component assembly holder of FIG. 1, in which the bore for the receptacle is closable by means of a pin of electrically conductive material;

FIG. 9, in a highly schematic sectional side view, shows a explosion-protected plug-and-receptacle arrangement for the explosion-protected modular subsystem housing and component assembly holder of FIG. 1, in which the bore for the receptacle is closed by a slitted membrane;

FIG. 10, in a perspective view, shows the membrane for the explosion-protected plug-and-receptacle arrangement of FIG. 9;

FIG. 11, in a side view, partially cut away, shows an explosion-protected plug-and-receptacle arrangement which can be used in both the component assembly holder and in the explosion-protected modular subsystem housing of FIG. 1 and is made in the "increased safety" explosion protection mode;

FIG. 12, in a partially sectional perspective view, is an enlarged illustration of one of the plug-in receptacles of the plug receptacle arrangement of FIG. 11; and FIG. 12a illustrates a plug or pin element with a resilient outer contact zone.

DETAILED DESCRIPTION

Figure 1:
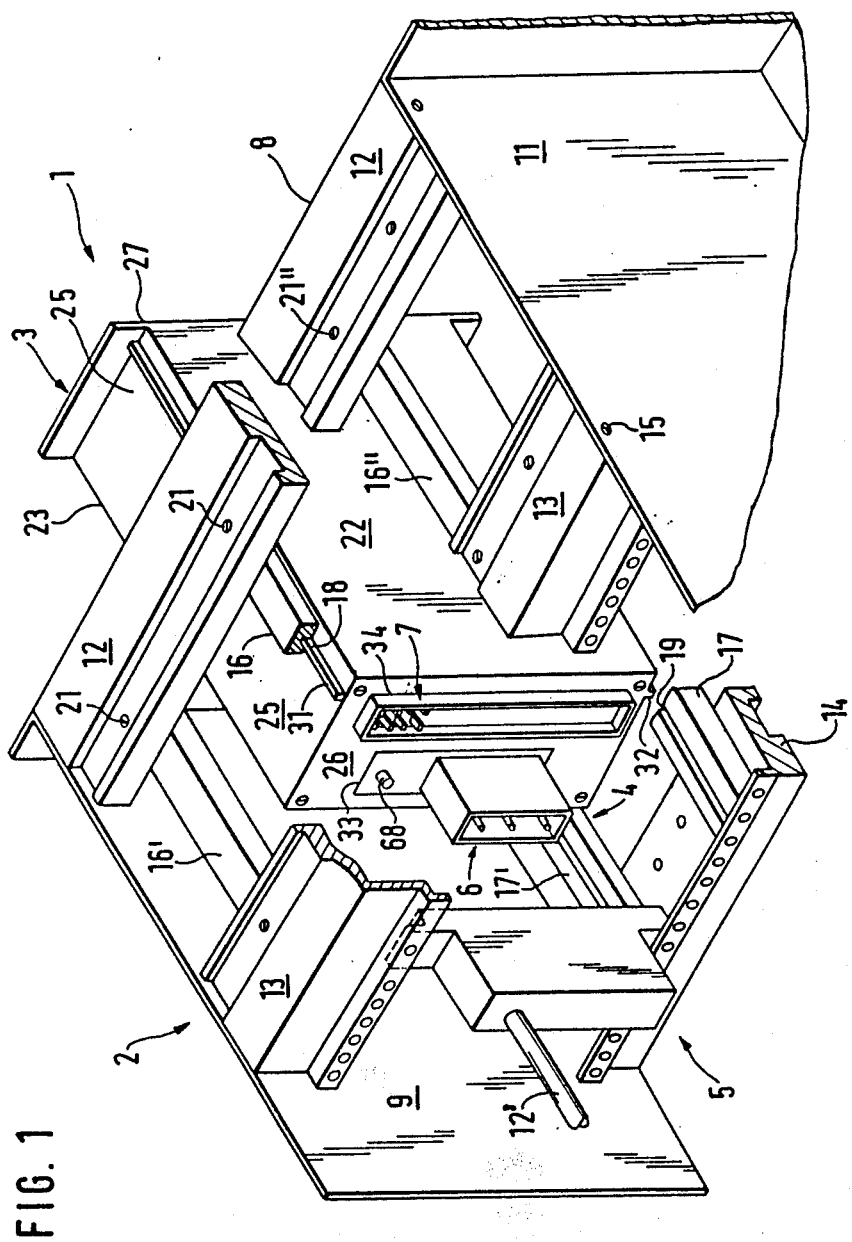

In FIG. 1, an explosion-protected modular plug-in system 1 is shown in a schematic, i.e. simplified, perspective view; this system has a component assembly holder 2, as well as explosion-protected modular subsystem housings 3 that are insertable into the component assembly, only one of these housings 3 being shown in the drawing. The electrical connection between the component assembly holder 2 and the modular plug-in housing 3 for "not intrinsically safe" circuits is via a two-part plug-in and receptacle connection arrangement 4, having a part 5 retained in the component assembly holder 2 and a part 6 attached to the modular subsystem housing 3, which part 5 together with part 6, in the plugged-in state, forms a flame-proof encapsulation as defined by IEC Standard IEC 79-1, or ANSI C33-30 and C33-27 for the contact means located in them. An electrical cable 12' is connected to part 5. The intrinsically safe circuits are connected via a plug-in terminal strip, of standard printed circuit board (PCB) construction (ANSI S815A), or the like, which is attached to the subsystem housing 3 and is available on the market. In the plugged-in state, this terminal strip 7 makes contact with a receptacle strip attached to the component assembly holder 2, the receptacle strip also being available on the market and not being shown in the drawing for the sake of simplicity.

The component assembly holder 2 includes a frame 8 having two side walls 9 and 11, which are connected to one another via a total of four support rails or struts 12, 13, 14 located upright on the side walls 9 and 11 and extending parallel to and spaced apart from one another. The bottom front support rail is not visible in the drawing, so that the elements it would otherwise hide can be seen. The support rails 12–14 are screwed by means of screws 15 to the two side walls 9 and 11, the two support rails 12 and 13 resting on the top or top edge of the side walls 9 and 11, while the other two support rails, of which only the support rail 14 is visible, are disposed on the bottom.

The support rails 12, 13, 14 retain guide rails 16 and 17, which as a pair 16 and 17 show include guide grooves 18 and 19 that are open toward and face one another. The guide rails 16 and 17 are screwed to the support rails 12, 13, 14 with screws 21, in such a way that they extend parallel to one another and spaced apart from one another and also parallel to the side walls 9, 11.

As needed, further guide rails 16' or 16" are secured with screws 21' and 21" in the frame 8 of the component assembly holder 2. Corresponding guide rails attached to the bottom, of which only the guide rail 17' is visible, are in alignment with these guide rails 16', 16".

The spacing of the guide rails 16, 17 from one another, as shown, corresponds to the height of the explosion-protected subsystems housing 3, so that the housing can be introduced inbetween the guide rails 16, 17 and held by them crosswise to the insertion motion.

Figure 2:
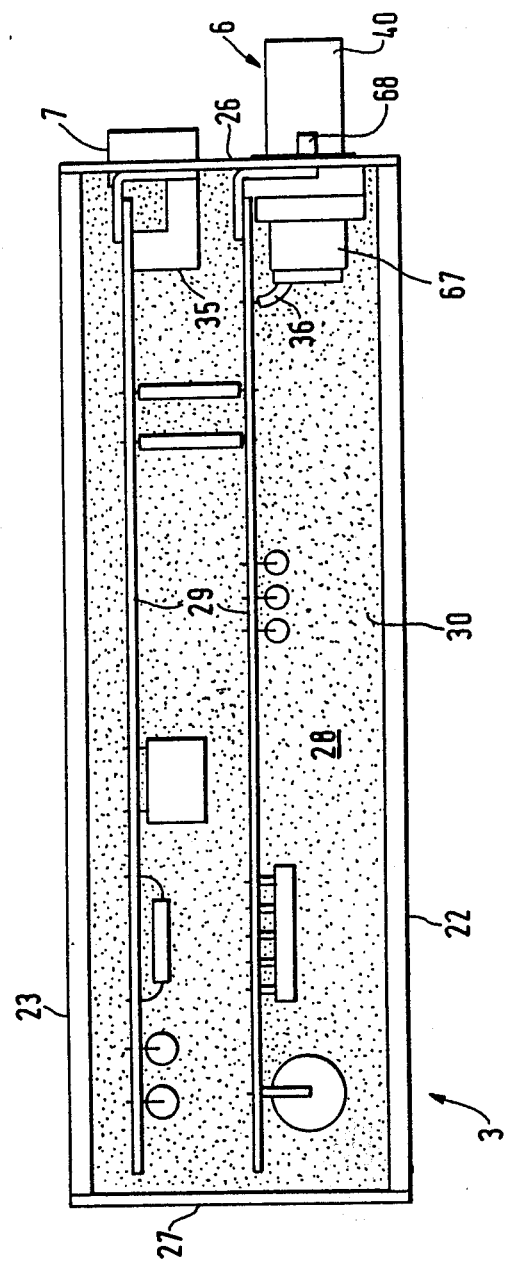
Figure 3:
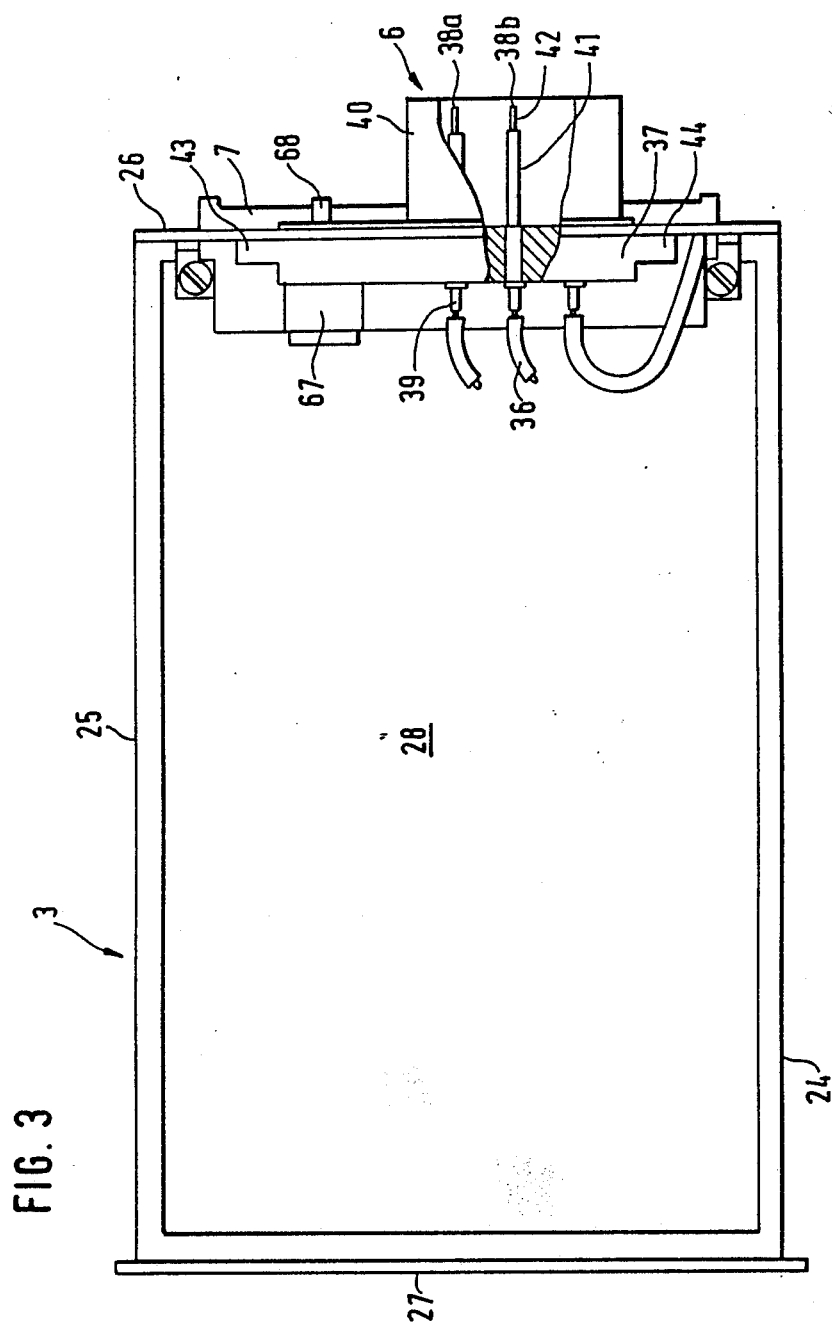

In FIGS. 2 and 3, the explosion-protected modular subsystem housing 3 is shown in its open state. This housing, with its two side walls 22, 23, a lower wall 24, and upper wall 25 and a back wall 26 and a front wall 27, is approximately block-shaped and defines a chamber 28 in which electronic components 29 that are installed on circuit cards are located. The chamber 28 of the explosion protected housing 3 is filled with sand or glass beads 30, thus producing a sand encapsulation for the components 29 housed therein; That is, the components 29 are protected in the explosion protection mode known as "sand filling" as defined can be connected to one another in any arbitrary manner, as long as the particular connection technique selected meets the applicable safety regulations and the components 29 in the chamber 28 are protected by the housing from dust and splashing or spraying water providing a degree of protection IP54 according to IEC 529. If this safety provision is adhered to, then the sand filling 30 will be retained in the chamber 28 and will perform its protective function.

Integrally formed onto the upper and lower walls 24, 25 of the subsystem are housing 2 two guide strips 31, 32 (FIG. 1) extending in the longitudinal direction of the housing 3, which in their dimensions are matched to the guide grooves 18, 19 in the guide rails 16, 17 and slide along in these grooves when the housing is inserted into the component assembly holder 2. At the same time they assure that the parts 6 and 7 of the plug-in connection arrangement 4 meet the parts 5 retained in the component assembly holder 2 in the correct manner when the housing 3 is inserted.

The end wall 26 of the housing 3 shown here includes two rectangular openings 33 and 34 located adjacent one another, into which part 6 of the flame-proof encapsulated plug and receptacle arrangement 4 and the plug-in terminal strip 7 are inserted. The terminal strip 7 is also formed and inserted in such a way that the housing 3 satisfies appropriate Safety Provision, e.g., the provisions of IEC 529-; the same is true for the part 6. In the interior of the housing 3, the contact means of both the plug-in terminal strip 7 and the explosion-protected plug-and-receptacle arrangement 4 are connected to the electronic component assembly 29 (FIG. 2), either by soldering extensions 35 of the contact means directly into the circuit boards of the component assembly 29, or by means of a free wiring or cabling 36, which leads from the contact means to the corresponding terminal points on the circuit boards.

Figure 4:
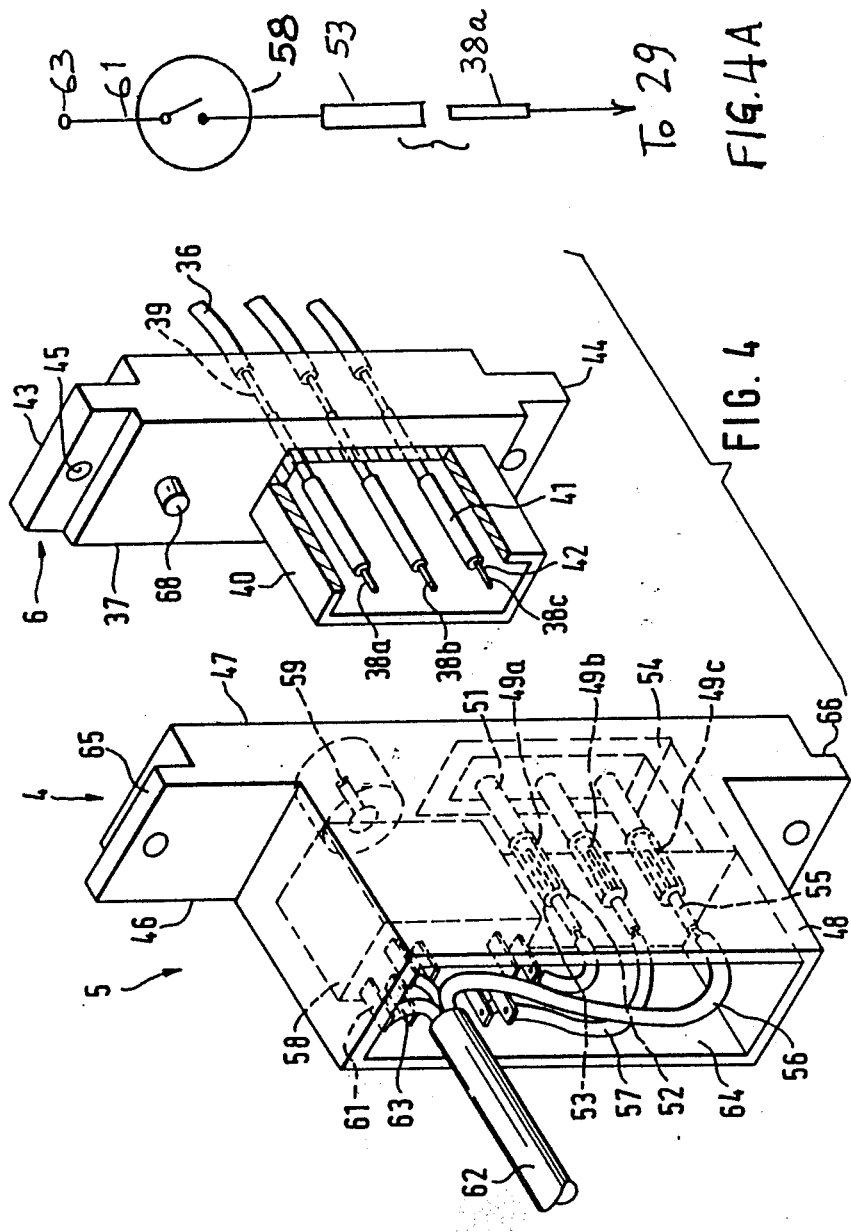

FIG. 4 shows part 6, normally secured to the housing 3 separated from part 5 of the explosion-protected plug-and-receptacle arrangement 4. Part 5 is screwed to the support rails 13 and 14 in the component assembly holder, which are shown in perspective, to a larger scale; the internal structure is also visible in FIG. 4.

Part 6 includes an approximately platform-like base body or block 37 made of insulating material, for example by an injection molding operation. In the exemplary embodiment shown, a total of 3 substantially cylindrical plug pins 38a, 38b, 38c are anchored in a pressure tight manner in the base body 37, for example by being injected into the base body 37 at the same time it is manufactured. The plug pins, at least on their surface, comprise a material that is a good electrical conductor and they protrude backward all the way through the base body 37, where they form terminal lugs or tabs 39 for the wiring 36. In order to retain the plug pins 38a . . . 38c, which extend at right angles to the base body 37 and thus at right angles to the back wall 26 of the housing 3, in an immovable manner, they have reductions in diameter and/or reinforcements, in a known manner, in the section that is embedded in the base body 37, thus producing an interlocking connection with the base body 37. The part of the plug pins 38a . . . 38c that protrudes outward from the housing 3 has two cylindrical portions 41 and 42, which are coaxial with one another but have different diameters; the longer portion 41 having the larger diameter is immediately adjacent the base body 37, while the portion 42 having the smaller diameter is located on the free tip of the plug pins 38a . . . 38c.

The group of a total of three plug pins 38a . . . 38c is tubularly surrounded by a protective collar 40, which is formed as a short rectangular tube 40 and is a unitary component of the base body 37. The protective collar 40 has a depth or length that at least corresponds to the length of the plug pins 38a . . . 38c; preferably, the plug pins 38a . . . 38c have their tips slightly recessed with respect to the front edge of the protective collar 40. Both the protective collar 40 and the plug pins 38a . . . 38c extend parallel to the guide strips 31, 32.

The protective collar 40 need not be closed all the way around but can include slits, should that be more favorable from a manufacturing process standpoint.

Part 6 is attached to the housing 3 with flanges 43 and 44, which are injection-molded onto the base body 37 and in the mounted state rest on the end or inside of the back wall 26. Bores 45 for fastening screws are provided in the flanges.

The part 5 of the plug and receptacle arrangement 4 attached to the retainer rails 13 and 14 of the component assembly holder 2 has a housing-like insulated base body or block 46, with a base plate 47 on the back side of which an extension 48 in the fashion of a square tubular segment is integrally molded in place. The base plate 47 includes cylindrical chambers or openings 49a . . . 49c, which correspond in number and arrangement to the number and arrangement pattern of the plug pins 38a . . . 38c, or are mirror-symmetrical thereto, and extend into the extension 48, where they are closed in a pressure-tight manner on their back side. The cylindrical chambers 49a . . . 49c are identical to one another and comprise a first cylindrical portion or bore 51 as well as a second cylindrical portion or bore 52 located behind it, in each of which an electrical plug-in socket or receptacle 53, e.g., a bushing or sleeve-like element, "sleeve" for short, is housed floating in the radial direction but nondisplaceably in the longitudinal direction. The diameter of the front cylindrical portion 51 corresponds to the diameter of the associated plug pins 38a . . . 38c in the portion 41 having the larger diameter, in such a way that whenever the plug pin 38a . . . 38c is inserted into the corresponding chamber 49a . . . 49c, a flame-proof gap as defined by the IEC, i.e., which is safe against flame-through is formed between the cylindrical bore 51 and the portion 41. Accordingly, with the plug pin 38a . . . 38c inserted, the cylindrical portion 52 in which the sleeve 53 is located forms a chamber that is closed in an explosion-resistant manner.

To assure that the joining of the two parts 5 and 6 is not hindered by the protective collar 43, the base body 46 has a correspondingly complementary recess 54 for receiving the protective collar 43. Neither the recess 54 nor the protective collar 43 have any protective function in the sense of explosion protection, explosion proofing or protection against flame propagation.

Each sleeve 53 housed in its own cylindrical chamber 49a . . . 49c has a terminal lug or tab 55 on its back, which protrudes into the tubular extension 48, where an electrical terminal line or connecting line 57 is undetachably connected.

Above the cylindrical chambers 49a . . . 49c, a monopolar or multipolar microswitch 58 is mounted in the base body 46. The microswitch 58 is of the "flame-proof encapsulation" arc-over protection type. An operating element 59 of switch 58 protrudes forward from the front side of the base plate 57 toward the part 6 that is to be introduced. Its terminal lugs or tabs 61 are located in the tubular extension 48. The electrical connections are so wired that the microswitch 58 breaks the connection when the part 6 is removed from the part 5 and removes voltage from sleeves 53, that is, in the case in question, the supply lines for the sleeves 53 in the cylindrical chambers 49 and 49b (see FIG. 4A) are connected through the microswitch 58.

The explosion-protected external electrical connection with the part 5 is accomplished via a multiplier cable 62. The individual leads, such as the lead 56, are either soldered directly onto a terminal lug 55 of a sleeve 53 or are welded on, or the single leads such a single lead 63 of which are connected to corresponding terminal lugs or tabs 61 of the microswitch 58, the cable 62 being electrically connected to corresponding sleeves 53 via other terminal lugs or tabs 61 and connecting lines 57. The interior of the extension 48 is potted in a known manner with a synthetic resin compound 64 once the permanent electrical connections have been made.

Lateral fingers 65 and 66 retain the part 5 on the support rail 13 and 14, at a location matching part 6 when the housing 3 is inserted, so that the electrical connection is established via the explosion-protected plug-and-receptacle arrangement 4.

In the event that the component assembly 29 housed in the housing 3 in turn contains storage elements for electrical energy, such as smoothing capacitors that are capable of furnishing voltages and currents to plug pins 38a through 38c and that are located outside the current voltage area considered to be intrinsically safe, a microswitch 67 (FIG. 3) can also be retained in the part 6, the microswitch being of the "flame-proof encapsulation" arc-over protection type. Its operating element 68 protrudes out of the base body 37, as shown. This microswitch 67 assures that when the part 6 is withdrawn, that is, whenever the plug pins 38a through 38c are pulled out of the part 5, the plug pins are switched to be de-energized or free from voltages (see FIGS. 2 and 3).

CONNECTION AND OPERATION

In the modular connection or plug-in system 1 shown in FIG. 1, whenever the explosion-protected housing 3 is inserted into the frame 8 between the corresponding guide rails 16 and 17 with its end wall 26 and with the part 6 secured thereto and the plug-in terminal strip 7 leading, the plug pins 38a . . . 38c force their way into the cylindrical bores 51 of the associated cylindrical chambers containing the sleeves 53, to the extent that the explosion-protected housing 3 has been pushed forward. Even before an electrical contact is made between the reduced-diameter portions 42 of the plug pins 38a . . . 38c and the plug-in sleeves 53, the portions 41 together with the bores 51 form a flame-proof safe gap of sufficient length defined by the IEC, so that whenever sparks are produced in the ensuring making of contact, the chamber in which these sparks could occur is already encapsulated in a flameproof manner as defined by the safety provision. Contacting occurs once the housing 3 is inserted far enough. In the course of further insertion, the plug pins 38a . . . 38c enter more deeply into the sleeves 53 with their reduced-diameter portions 42. At the same time, the operating elements 59 and 68 of the microswitches 58 and 67 are also depressed, thereby closing the electrical connections that they had interrupted. Once the explosion-protected housing 3 is inserted all the way, the "not instrinsically safe" current circuits to the electronic component assembly 29 in the housing 3 are closed via the explosion-protected plug-and-receptacle arrangement 4. At the same time, the electrical connections of the of the intrinsically safe "current circuits are effected via the plug-in terminal strip 7 and a corresponding receptacle terminal strip (not shown), which like the part 5 are secured to the rear support rails 13 and 14 at the corresponding location.

When the housing 3 is removed, the situation is the reverse; by removal of the plug-in terminal strip 7, the intrinsically safe "current circuits are interrupted. The "not intrinsically safe" current circuits are also broken. Any sparks that may result upon opening will occur on the cylindrical chambers 49a . . . 49c, which are flameproof encapsulated chambers. They are closed off at the back by means of the potting compound 64 and at the front of the part 5 by the flame-proof gap formed between the bore 51 and the corresponding portion 41 of the plug pin 38a . . . 38c. Also, and separately, when the housing 3 is pulled out, the operating elements 68 and 59 of the microswitches 58, 67 are no longer depressed. The microswitches 58 and 67 interrupt the electrical connections with the corresponding sleeves 58 or plug pins 38a . . . 38c, thereby disconnecting them from voltage.

As is apparent, no additional switch needs to be arbitrarily actuated prior to the insertion or removal of the housing 3, since all the necessary interruptions of current and voltage automatically take place when the housing 3 is pulled out, or, conversely, the necessary connections are established upon insertion. The sleeves and plug pins involved can take on switching functions, and the resultant switching operation that takes place is effected in chambers that are each encapsulated so as to be flameproof.

Instead of potting the electrical connections between the sleeves 53 and the supply line 62, an "increased safety" connection chamber can be provided on the back side of the part 5, the supply line 62 being clamped in place in the chamber with clamping screws.

In order to meet the necessary safety provisions, the metal parts of the electrical plug-and-receptacle arrangement need not necessarily be disconnected from voltage; it is also sufficient for them to be covered by simple means. In that case, the electrical switching operation necessarily occurs as a result of the separation of the plug pin and sleeve from one another.

Exemplary embodients in which the sleeves are covered after the housing 3 is pulled out are shown in FIGS. 5–10, in which the same reference numerals are used for equivalent elements. FIGS. 5–10 are also shown highly simplified, and parts 5 and 6 of the plug-and-receptacle arrangement are shown only in fragments. Thus the plug pins 38 are shown with the same diameter throughout, and the other provisions such as potting and the like are not shown.

EMBODIMENT OF FIG. 5

A slider 71 is guided in the base body 46 in a longitudinally displaceable manner and when the part 6 is withdrawn it closes the bores 50. To this end, the base body 46, just behind the outer mouth of the bores 50, includes a rectangular conduit 72 that extends at right angles to the axes of the bores 51 that are parallel to one another. Located in this conduit 72 is an elongated finger 73 of rectangular cross section and having openings 74 arranged in the pattern of the bores 50, so that in one position of the finger 73 in the conduit 72, the portion of the bores 51 located behind the slider 71 is accessible from the front.

An operating element 75 is integrally connected to the upper part of the finger 73 and has a beveled operating face 76 oriented toward the part 6 of the plug-and-receptacle connection arrangement 4. The operating element 75 is displaceable in a recess 77 in the base body 46 in which a helical spring 78 is located, the helical spring engaging the underside of the operating element 75 and biasing the slider 71 into a position in which the bores 50 are closed off from the outside. In this position the openings 74, as shown, are each located slightly above the bores 50. Upon insertion of the part 6 into the part 5, the protective collar 43 comes into engagement with the beveled face 76, so that upon further insertion the operating element 75 is pushed into the recess 77. At the same time, the finger 73 is also pushed downward in the conduit 72, and once the terminal position has been attained the openings 74 are aligned with the bores 50, enabling free passage of the plug pins 38 into the bores 50.

Conversely, the slider 71 recoils into the position shown in FIG. 5 as soon as the part 6 is pulled out and the collar 43 has moved free of the operating element 75. The compression spring 78 pushes the slider 71 upward into a position in which the openings 74 are offset with respect to the bores 50, which are thereupon closed.

EMBODIMENT OF FIG. 7

The closure of the bore 50 is effected by means of a pin 81 made of an insulating material. The sleeve 53 has by a cup-shaped extension 82 joined rearwardly, into the opening of which a closure screw 83 is screwed. The closure screw 83 can in turn be formed as a terminal clamp and to this end includes an internal thread, for example, not visible here, into which a clamping screw 84 can be screwed. On the face end protruding into the cup-shaped part 82, the closure screw 83 has a centering pin 85, onto which a compression spring 86 formed as a helical spring is fastened. The other end of the helical spring 86 is supported in a cup-shaped extension 87 of the pin 81, so that the compression spring 86 urges the pin 81 forward through the sleeve 53 into the bore 51. Upon insertion of the part 6 into the part 5, the plug pin 38 pushes the pin 81 before it, all the way through the sleeve 53 into the cup-shaped extension 82 thereof, thereby uncovering the bore 51. Once again, the pin 38 forms a flameproof gap with the bore 51 even before the forwardmost tip of the plug pin 38 makes electrical contact with the sleeve 53.

Conversely, when the part 6 is pulled, the bore 51 is closed by means of the cylindrical pin 81, which upon retraction of the part 6 is pushed forward all the way through the sleeve 53 into the bore 51 by the compression spring 86.

EMBODIMENT OF FIG. 8

The sleeve 53 is located farther to the rear, and a pin 91 made of an electrically conductive material is capable of reciprocating between the bore 50 and the sleeve 53. The pin 91 has a shaft 92 that is located in the bore 50 and merges integrally with a flange 93 of larger diameter. The flange 93 rests against an annular shoulder that is formed at the transition from the cylindrical chamber 49, in which the sleeve 53 is housed, to the bore 50. On its face end facing the sleeve 53 and on which a compression spring 94 formed as a helical spring is supported, the flange 93 has a further cylindrical pin 95, which is intended for insertion into the sleeve 53.

In this exemplary embodiment, whenever the plug pin 38 enters into the bore 50 upon insertion of the housing 3, the plug pin 38, which comes into engagement with the outer end face of the cylindrical shaft 92, pushes the pin 91 before it, counter to the action of the spring 94. The cylindrical shaft 95 thus is pressed into the sleeve 53, so that an electrical connection of the sleeve 53 with the face end of the plug pin 38 is established via the pin 91.

When the plug pin 38 is pulled out, as a result of a separation of the part 5 and 6, the compression spring 94 pulls the cylindrical pin 95 back out of the sleeve 53, so that there is no further electrical connection with the pin 91.

The compression spring 94 is supported in the interior of the base body 46 on an insulating element 96 that surrounds the sleeve 53.

EMBODIMENT OF FIGS. 9 and 10

The bores 50 are closed by means of a membrane 97 made of a rubber elastic material, which is attached to the side of the base body 46 oriented toward the part 5 in front of the bores 51, where it is retained by a fastening plate 98. The fastening plate 98 includes openings 99 aligned with the bores 51, the plug pins 38 being capable of passing all the way through these openings 99. At the points at which the bores 51 are located behind the membrane 97, the membrane 97 is provided, as shown in FIG. 10, with slits 101 arranged in a star pattern, producing small triangles that the triangles are defined on two sides by cuts. Beyond the cuts, are integrally connected to the remainder of the membrane 97. Upon insertion of the part 6, the plug pins can pass through the membrane 9 wherever the star-like slits 101 are provided, so as to enter the bores 51 located behind them. So that the material of the membrane 97 that escapes toward the back will not be squeezed at the edges of the bore 51, the bores 51 imediately behind the membrane 97 are provided with cylindrical recesses 102, which provide space for the escaping parts of the membrane.

As soon as the part 6 is retracted, the membrane parts elastically return to their initial position, which is shown in FIG. 10, and close the bores 51 in accordance with the German Safety Provision IP 54.

EMBODIMENT OF FIGS. 11 AND 12

Instead of a plug connection with a flameproof encapsulation of the contact means, a plug-and-receptacle connection 4' can also be used, on which the contact means 88, are formed in the "increased safety" protection mode, in order to establish the electrical connection of the housing 3 and the component assembly holder 2. This kind of plug-and-receptacle arrangement is shown schematically in FIGS. 11 and 12, in which the same reference numerals are used for elements already described that appear again here.

The plug-and-receptacle connection of FIGS. 11 and 12 again includes a part 5 that is to be retained in the component assembly holder 2 between the support rails 13 and 14, this part 5 comprising a base body 46 with an integrally connected base plate 47 and the fastening extension 65 and 66. The base plate 47 includes three cylindrical bores 111a . . . 111c, in which the sleeves 53a' . . . 53c' *are located in a floating fashion. The sleeves 53a'. . . 53c' are only sightly recessed with respect to the flat front of the base plate 47 and are retained in an axially undisplaceable manner.*

In order to meet the provisions of "increased safety" each of the sleeves 53a' . . . 53c' includes a great number of contact blades or strips 112, which are resiliently movable within a certain range largely independently of one another and make contact with the plug pin 38a . . . 38c to be introduced.

A structure providing a great number of resiliently elastic contact blades or strips is shown in FIG. 12. As seen there, the sleeve 53a', *shown there on a larger scale, and is substantially formed by a cylindrical sleeve having an inner diameter (ID) of approximately 2 mm.* It has an encompassing groove 114 just behind its front insertion opening 113; this groove 114 is punched into the inner circumferential surface of the sleeve 53a' and extends over a considerable distance in its longitudinal direction, yet it has only a comparatively slight radial depth. Inserted into this groove 114 is an approximately cylindrical metal contact element 115 that is slit at a plurality of locations, the axial extension of which is slightly larger than the axial extension of the groove 114, so that by reason of the shape it has prior to the insertion, the contact element 115 is pre-curved in a convex manner toward the longitudinal axis of the sleeve 53a'. The inner diameter of the contact element 115, which on its face ends is supported on the flanks of the groove 114 located in the axial direction with respect to the sleeve 53a', is less than the inner diameter of the sleeve 53a' in the remaining cylindrical region, that is, is also less than the outer diameter of the plug pin 38a to be inserted.

In order to obtain the multiple contact blades or strips that are moveable independently of one another, the contact element 115 bent in a tubular shape, which is provided with a continuous longitudinal slit at 116, is provided with a great number of slits 117 closed at the ends, which between them define contact blades or contact strips protruding toward the interior and forming the contact points 112. Because of the non-continuous slits 117, these contact blades or strips 112 are integrally coherent with one another at two strips 118, 119, extending in the circumferential direction; these two strips 118, 119 are interrupted only in the vicinity of the continuous slit 116.

In order to establish multiple resilient contact points with the sleeve 53a' as well, the two strips 118, 119 extending circumferentially are slit or notched at multiple points from their axially outer edge inward, resulting in fingers 119, 121 that are resilient independently of one another and extend in the axial direction, the fingers being supported on the flanks of the groove 114; by way of these fingers 119, 121, the contact of the contact element 115 with the base body of the sleeve 53a' is established.

Upon insertion of the plug pin 38a, the outer circumferential face of the plug pin 38 comes into contact with the contact blades 112 and presses them radially outwardly. In so doing, each of the contact blades 112 moves largely independently of the adjacent contact blades, and when the plug pin 38a is pulled out returns resiliently, again independently of the other contact blades 112, into the initial position shown in FIGS. 11 and 12.

Figure 11:
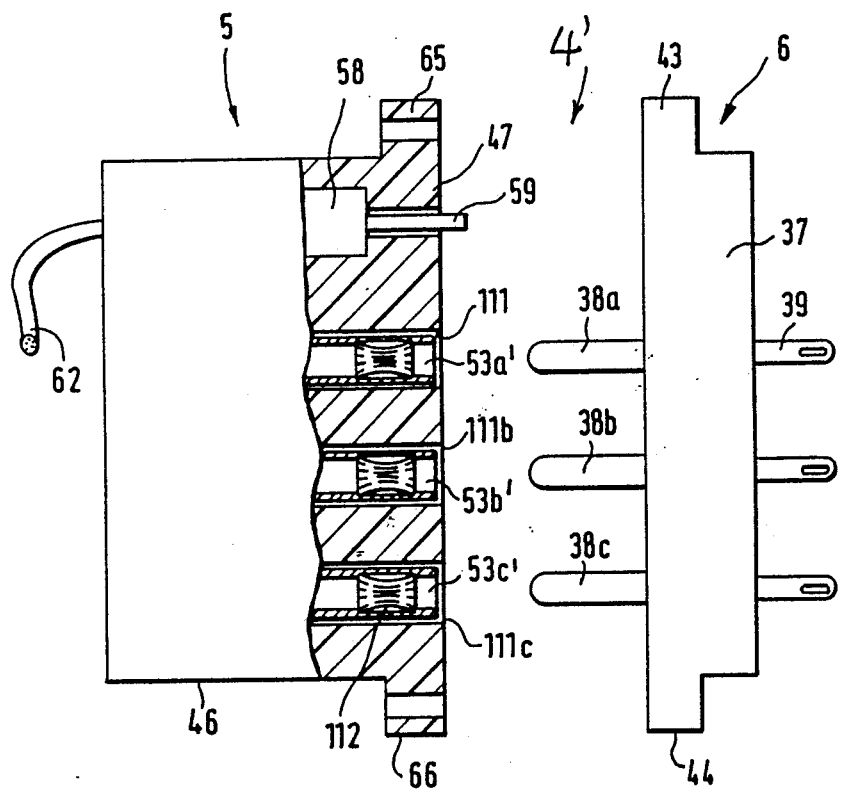

In order that the interruption of current not be effected by a separation of the contact means 38, 53' in this embodiment of the plug-and-receptacle arrangement 4, which could cause sparks capable of causing explosions, the multi-polar electrical switch 58 is provided, as in the previous example of FIG. 4, at least in the part of the plug-and-receptacle arrangement 4 that is connected with voltage sources. In FIG. 11 this is for example part 5; the operating element 59 of this switch 58 protrudes through the front plate 47 toward the part 6 that is to be inserted. The switch 58 is again encapsulated in flameproof fashion and its switching paths are located in series with the sleeves 53a' ... 53c', *so that when the switch 58 is deactivated the sleeves 53a' ... 53c' are disconnected from voltage and have no connection* with the leads of the cable 62.

The arrangement between the actuating stroke of the switch 58 and the plug-in or separation movement between the two parts 5 and 6 is selected such that for example for plugging the two parts 5 and 6 into one another, the smoothly cylindrical plug pins 38a ... 38c on the outer circumferential face first make electrical contact with the contact blades 112 and thus with the sleeves 53a' ... 53c' as well, before the operating element 59 comes into engagement with the part 6, in order to change the flameproof encapsulated switch 58 into the switched-ON position. Making contact between the contact means 38 and 53 already meets the "increased safety" provision, once the operating element 59 is finally actuated by the part 6 as part 6 approaches more closely part 5, in the course of the continuing fitting together the two parts 5 and 6. When the switching path of the switch 58 closes, the current circuits via the connecting means 38, 53 are connected.

Conversely, and for disconnection, all the current circuits via the contact paths that are formed by the contact means 38 and 53 are interrupted by switch 58 even before the plug pins 38a ... 38c, in the separation of the two parts 5 and 6, have moved free of the contact means 112 of the sleeves 53a' ... 53c'. The paths of the flameproof encapsulated switch 58 and between the sleeves 53a' ... 53c' and the associated plug pins 38a ... 38c, form together connections which all meet the safety provisions for the "increased safety" mode.

Figure 12A:

Instead of placing the contact means that are movable independently of one another in the sleeve 53a' ... 53c', *these means can be located on the plug pins 38a ... 38c* as well; in principle, a contact element that is similarly formed as to the contact element 115 is suitable, as long as it is convexly curved outwardly or in barrel-like fashion away from a center axis of the plug pin. The plug pins 38a ... 38c may, as FIG. 12A shows schematically, be in the shape of a pin 38', similar to a "banana" plug. The plug pin 38a ... 38c is formed of a large number of individually movable spring fingers. In both these last two cases the sleeve 53a' ... 53c' can be formed as a simple smooth-walled sleeve.

Particular savings in terms of space are obtained if at least part of the plug-and-receptacle arrangement 4 includes plug pins 38 that are individually and inherently encapsulated in a flameproof manner when the plug-and-receptacle arrangement 4 is plugged together, because then the volumes to be explosion-proof arrangements are very small. Considerably reduced wall thicknesses suffice, as compared with wall thicknesses of apparatus of larger volumes. If a plurality of plug pins 38 have to be encapsulated, in a flameproof manner, in a common structure, the volume and space required increases quickly. Flame-proof encapsulation can be attained in a simple manner by providing one part of the plug-and-receptacle arrangement 4 with the bore 51 which, with the plug pin inserted, forms a flameproof gap with it. The electrical contact point for the plug pin 38 can be located behind the part of the bore, with respect to the insertion direction of the plug, which forms the flameproof gap. The wall of the bore is of electrically nonconductive material. This contact point may be formed by a sleeve or receptacle 53 into which the plug pin finally enters.

Since the plug pins 38 have a relatively long length in order to form, with bore 51, the flame-proof gap, and on the other hand the sleeves 53 also occupy space in the radial direction, the plug pin 38 suitably has an enlarged diameter, by comparison with a portion located toward its front end, which in the inserted state enters into the sleeve, in the vicinity of the explosion-proof gap that is formed. In this manner the outside diameter of the sleeve can be approxiately equal to the outside diameter of the plug pin at its thickest point, while on the other hand sufficient mechanical strength is obtained.

In order to meet safety standards (e.g., IEC 529, Provision IP 54) when the plug-and-receptacle arrangement 4 is separated, it is possible either to use switch means for disconnecting the voltage-carrying sleeves or plug pins from voltage, or to cover the sleeves 53 with covering means that close automatically.

The covering means may be formed by one or more sliders 71 that are retained longitudinally displaceably crosswise to the longitudinal axis of the bores 51 for the sleeves 53 and include openings corresponding to the pattern of the bores, so that in the slider position the bores are closed and in the other slider position the bores are uncovered; the actuation of the slider or sliders takes part when the two parts of the plug-and-receptacle arrangement 4 are plugged into one another.

It is also possible to close the bores with a pin 92 (FIG. 8) that is retained in both the bore and the sleeve in a longitudinally displaceable manner and is pressed backward upon insertion of the plug pin 38 into the sleeve, while when the plug pin is pulled out the pin is pushed forward into the bore by a compression spring 94. In the event that the pin closing the bore is not made of insulating material but rather of electrically conductive material, the sleeve can be set back with respect to the bore defining the flameproof gap, and the displaceable pin can be retained such that it can reciprocate inbetween the bore and the sleeve, so that in one position the pin makes electrical contact with the sleeve, while in the other end position, the electrical connection is interrupted, while the actuation of the pin is effected by means of the plug pin.

A very simple way to effect closure, is finally, to provide a membrane 47 (FIG. 10) of insulating material in front of the bores, which is slit or cut in the vicinity of the bores in such a way that the plug pins 38, when the parts of the plug-and-receptacle arrangement are plugged together, are capable of passing through the membrane and entering the bores or sleeves, while when the plug pins are pulled out the membrane returns to its initial position, so as to close off the bores (e.g., as provided by IEC 529 Safety Provision IP 54).

The novel modular housing 3 is preferably used in a component assembly holder 2 that has, in a frame, one or more pairs of guide elements for the housings; upon insertion of the housing these pairs of guide elements receive that housing's guide elements; at the point at which the part of the plug-and-receptacle connection oriented toward the housing comes to rest when the housing has been inserted, the complementary part of the plug-and-housing arrangement is provided. In addition, not protected plug-and-receptacle arrangements can also be retained on holder 2, which could provide connections for intrinsically safe circuits.

In order to obtain good protection of live parts from being inadvertently touched by operators, it is advantageous for the parts of the plug receptacle arrangement 4, which are located in part 5 of the component assembly holder 2, not to have projecting plug pins.

The component assembly holder 2, together with the explosion-protected module subassembly housing 3, forms a modular connection system which allows insertion of modular housings of arbitrary size and shape, or removal of such housings without having to shut off the voltage to other modules 3 inserted in the component assembly holder, while preventing explosions due to arcing.

The part 5 of the plug-and-receptacle arrangement in the component assembly holder includes either an "increased safety" connection chamber for the connection of the connecting lines, or in a known manner, the connecting lines are potted in an explosion-proof manner in part 5 of the plug-and-receptacle arrangement.

In addition to the flameproof encapsulation of the contact means of the plug-and-receptacle arrangement, it is also possible for the contact means to be formed in the "increased safety" mode defined by IEC 79.7, in order to obtain a readily interchangeable modular housing. In that case, at least in the part of the plug receptacle arrangement having contact means that would otherwise be subject to voltage after the separation of the two parts from one another, a switch means, e.g., microswitch 58 of the "flameproof encapsulation" type is provided. By means of the switch 58, the contact means are disconnected from voltage. The three-dimensional arrangement is such that the switches 58 do not close until the electrical connection between the contact means and connection plug is already established when the parts are plugged into one another. For disconnection, and, when the parts are unplugged from one another, the switch or switches 58 first disconnect the electrical connections even before the contact means have become disengaged from the associated plugs.

In the embodiment of FIGS. 11 and 12, the paths formed by facing contact means of the two parts includes a large number of contact points, which are resiliently movable largely independently of one another. This assures that in the particular allowable current range at least some contact points retain their mechanical and hence electrical connection, so that not all contact means can disconnect at once, which could cause sparks.

The contact points that are movable independently of one another can be provided selectively in the contact means embodied as sleeves or receptacles (FIGS. 11,12), or on the contact means can be formed as plugs (FIG. 12A). However, providing resilient contacts in sleeve form has the advantage of better protection for these resilient contact points, which in view of the necessary miniaturization are delicate and therefore do need protection.

As movable contact points, blades that are formed on a correspondingly slit sheath, and banana plugs such as those used in the high frequency work, for example, are suitable.

Various changes and modifications may be made, and features described with any one of the embodiments may be used with any of the others within the inventive concept. Specifically, the position of the receptacle elements and the plug elements on the respective parts 6 and 5 may be reversed without departing from the present invention.

I claim:

1. A modular connection and plug-in system including means for electrical connection and mechanical retention of selectively replaceable explosion-protected electrical subsystems, said system having
a frame (2, 8);
a plurality of said electrical subsystems, at least one of said subsystems including
an explosion-resistant modular housing (3) defining a chamber (28) therein, said modular housing being selectively positioned in said frame and individually removable therefrom, and electrical components (29) located in the chamber (28) of the housing (3) of the at least one subsystem;

said system further comprising a two-part plug and receptacle arrangement (4) for said at least one of said subsystems, each plug and receptacle arrangement having a first connection part (5, 51, 53) located on the frame (2, 8) and a second connection part (6, 38) located on said housing (3) to permit individual removal of said at least one subsystem;

connection means (35, 36) in the housing (3) for providing electrical power via said plug and receptacle arrangement (4) to the electrical components (29) in the respective chamber (28) of the housing (3), means (12', 62) for coupling electrical energy to said at least one subsystem at energy levels which are "not intrinsically safe";

and comprising means for rendering said plug and receptacle arrangement (4) capable of transferring electrical energy at levels which are "not intrinsically safe" in an explosion endangered environment and for permitting selective severing and removal of said at least one subsystem from the frame without interrupting, to said coupling means, electrical energy supply at said levels which are "not intrinsically safe", said energy transfer and selective severing means comprising said first connection part (5, 51, 53) being secured in the frame (2, 8) and forming one element of a separable two-part interengaging flame-proof plug-and-receptacle connection system;

said second connection part (6, 38) being secured to the explosion-resistant housing (3) and forming a second element of the separable two-part interengaging flame-proof plug and receptacle connection system; and wherein the means (12, 62) for coupling electrical energy at said levels which are "not intrinsically safe" are connected to the first connection part.

2. The system of claim 1, wherein the flame-proof plug and receptacle connection system, and the means for coupling the electrical energy to the first part, together form a combination "flame-proof" connection assembly.

3. The system of claim 1, wherein said first part (5) is formed with a connection chamber (64) of the type of "increased safety" and includes terminal means; and said means (12', 62) for coupling electrical energy comprises a supply connection located in said connection chamber; and said connection chamber is shaped to provide at least protection defined by "increased safety" standards.

4. The system of claim 3, further including encapsulating means for encapsulating said supply connection within said connection chamber (34).

5. The system of claim 4, wherein the means (12', 62) for coupling the electrical energy to the plug-in and receptacle arrangement (4) comprises an "increased safety" connection suitable for placement in a hazardous environment.

6. The system of claim 1, wherein at least one part (6) of the plug-in and receptacle connection arrangement (4) comprises a connection pin or plug (38); and wherein the other part (5) includes a block (46) formed with at least one bore (50, 51) dimensioned to slidingly, yet snugly, receive said connection pin or plug to form with said connection pin or plug a flame-proof seal.

7. The system of claim 6, wherein the plug and receptacle arrangement (4) includes a receptacle sleeve means or bushing (53) of conductive material, located interiorly of said bore (50, 51); and the pin includes conductive means engageable with said sleeve means or bushing (53), said pin being dimensioned to fit into said bore and form said flame-proof seal, and extending therebeyond, said plug or pin penetrating into said sleeve or bushing to provide an electrical connection between said sleeve or bushing and the plug or pin.

8. The system of claim 1, wherein both parts (5, 6) of the plug and receptacle arrangement (4) include, each, a base body or block (37, 46) and terminal means (38, 53) secured on the respective base body or block;

the base body (46) or block of the first part (5) being formed with a bore (51);

the base body or block (37) of the other part (6) including at least one projecting plug element (38), the respective bores and plug elements being positioned in alignment, and wherein the bore (51) and the plug element (38) are diametrically and longitudinally dimensioned to form an elongated flame-proof gap;

a terminal element (53) located within said bore at a position therein remote from said gap; and wherein the wall of said bore (51) comprises electrically insulating material.

9. The system of claim 8, wherein said terminal element comprises a sleeve means or bushing.

10. The system of claim 8, wherein the plug element comprises a projecting pin having two longitudinally staggered portions (41, 42) of different diameters, the portion with the greater diameter (41) fitting in said bore within said gap, and the portion of lesser diameter (42) projecting therefrom and contacting said terminal element (53).

11. The system of claim 1, further including at least one switch (56, 67) of the explosion-safe type, located on at least one (5) of said parts (5, 6);

terminal means located on said parts and engageable with each other; and wherein said at least one explosion-safe type switch (58, 67) is located in series circuit with at least one of said terminal means and includes an operating element engaged upon engagement of said parts, said switch being connected to disconnect the respective terminal means, and opening or disconnecting said series circuit in advance of separation of said terminal means upon separation of said parts (5, 6) and confine any arcing due to interruption of said series circuit within said explosion-safe type switch and thereby prevent arcing at said terminal means.

12. The system of claim 11, wherein said at least one explosion-proof switch (58, 67) comprises a switch structure suitable and designed for placement in a hazardous, explosion-endangered environment, and further comprises flame-proof encapsulation.

13. The system of claim 11, wherein said at least one switch (58) is electrically located between the respective terminal means and the means (12', 61) for coupling electrical energy at said level which is "not intrinsically safe".

14. The system of claim 1, further including at least one switch (58, 67) of the explosion-safe type, located on at least one (5) of said parts (5, 6);

separable terminal means (53, 38) located on said parts (5, 6) and engageable with each other and, respectively, connected to said electrical energy coupling means (12', 62) for coupling electrical energy to said first part and to the connection means (35, 36) for the electrical components (29) in the housing (3); and wherein said at least one switch (58, 67) is located in series circuit with at least one of said terminal means and includes a switch operating element (59, 68) engageable upon engagement of said parts (5, 6), said at least one switch being connected to disconnect the respective terminal means in advance of separation of said terminal means upon separation of said parts (5, 6) to prevent said terminal means from being under voltage during separation, and hence arcing at said terminal means.

15. The system of claim 1, wherein (FIGS. 6–10) both said parts (5,6) of the plug-in and receptacle arrangement (4) include, each, a base body or block (37, 46) and terminal means (38, 53) secured on the respective base body or block;

wherein said first part (5) is formed with a bore (50, 51) and the terminal means includes a terminal element (53) located interiorly of said bore.

the terminal means further includes projecting plug or pin elements (38) secured to said second part (6); and closure means (71, 81, 91, 97) are provided for closing off said bore (50, 51), said closure means closing the bore upon removal of the plug or pin elements (38) from the bore.

16. The system of claim 15, wherein (FIGS. 5 and 6) the closure means comprises at least one elongated slider, being movable between an "access" position and a "closed" position on said block to close off said bore (50, 51) or permit access thereto;

and wherein said slider and said second part (6) are formed with engagement means (43; 75, 76) to provide for placing said slider into "access" position upon engagement of said first and second parts (5, 6), while permitting said slider to move to "closed" position upon disengagement of said parts.

17. The system of claim 15, wherein (FIGS. 5, 6 and 7) a plurality of bores (51) are provided, located in longitudinal alignment and extending into the block; and the closure means includes a single slider (71) having a pattern of openings (74) matching said bores, and being movably located on said block to shift the alignment of said openings with respect to said bores;

an operating element (76) located on said slider;

and a protective collar (43) located on the second part (6) and having an engagement portion engageable with the slider to shift the slider (71) in a position to provide access to the bores (51).

18. The system of claim 15, wherein (FIG. 7) the closure means comprises a pin element (81) of electrically non-conductive material, longitudinally slidable in said bore (51);

spring means biasssing said non-conductive pin (81) in a position such that, upon disengagement of a plug or pin element (38), the non-conductive pin essentially fills said bore, but permitting penetration of said plug or pin element in said bore and connection with the terminal element (53) therein.

19. The system of claim 15, wherein (FIG. 8) the closure means includes an electrically conductive connecting pin (91) located in the bore (50) in the region of the explosion safe gap;

spring means biasing said pin in a position remote from a terminal element (53) within said bore, said pin being engageable by the plug or pin element (38) on said second part (6) for establishing electrical connection between said terminal element (53), said plug element (38) and said connecting pin (91).

20. The system of claim 15, wherein (FIGS. 9, 10) the closure means comprises a membrane (97) of electrically insulating elastic material, located in advance of the bore (50, 51), said membrane being formed with slits (101) in the region of the bore;

said plug or pin elements, penetrating through said membrane in the regions of the slits (101) for engagement into said bore (50, 51) and with the terminal element (53) therein upon engagement of said parts (5, 6), said membrane, upon removal of said plug or pin elements, resiliently closing the bore.

21. The system of claim 1, wherein the housing (3) comprises a modular housing structure having a wall (26);

and wherein the second part (6) is secured to said wall.

22. The system of claim 1, wherein said chamber (28) includes a sand filling to provide for explosion protection thereof.

23. The system of claim 1, wherein said chamber includes a potting compound to provide for explosion protection thereof.

24. The system of claim 1, wherein the electrical components (29) within the housing (3) are encapsulated by flame-proof encapsulation.

25. The system of claim 11, wherein (FIGS. 11, 12, 12A) said terminal means include a plurality of essentially independently springy or resiliently movable contact blades or strips (112).

26. The system of claim 25, further including a bushing or sleeve element (53) forming the receptacle connection part of the plug-in and receptacle arrangement (4), said independently movable connecting blades or strips (112) defining contact and connection engagement points or regions and being located within said bushing or sleeve.

27. The system of claim 11, wherein two explosion safe switches (58, 67) are provided, one each being located on each of said parts (5, 6).

28. The system of claim 1, for combination with further separable connections means including a plug-in terminal strip (7) which is capable of transferring electrical energy only at levels which are "intrinsically safe".

29. The system of claim 1, wherein the frame (8) includes paired guide means (16, 17), and said housing includes complementary guide portions engaged by said guide means, said guide means spaced from each other and, in combination with said guide portions, guiding the housing and said second part (6) thereon in position relative to first part (5) of the frame for interengagement of the plug and receptacle arrangement (4).

30. The system of claim 14, wherein two explosion safe switches are provided, one each being located on each of said parts (5, 6).

31. The system of claim 1, wherein at least one of the frame and the housing includes parallel guide elements (31, 32) spaced from each other;
wherein the first connection part (5) is located on the frame positioned in alignment with the space between said guide elements and wherein the second connection part (6) is located on the housing positioned in alignment with the space between said guide elements.

32. The system of claim 1, wherein the housing (3) is formed with an opening (33) in which the second part (6) of the plug-and-receptacle connection system (4) is secured.

33. The system of claim 1, wherein both connection parts (5, 6) of the plug and receptacle arrangement (4) include a base body or block (37, 46) and terminal means (38, 53) secured on the respective base body or block.

34. For use in an explosion-endangered location and environment,
a modular electrical system having
a frame (2, 8);
a plurality of electrical subsystems located on said frame, at least one of said electrical subsystems including
an explosion-resistant modular housing (3) defining a chamber (28) therein, and electrical components (29) located in said chamber, said housings, each, being selectively individually separable from said frame; and
electrical power supply and electrical energy transfer means (12', 62) for transferring electrical energy to said subsystems at energy levels which are "not intrinsically safe", and
comprising
individual plug and receptacle arrangements (4) having
a first connection part (5, 53) secured to the frame, and, each, electrically connected to the power supply means (12', 62), and
a second connection part (6, 38) secured to the explosion-resistant housing (3) and electrically connected interiorly of the housing to said electrical components (29); and
means for permitting individual separation and removal of any explosion-resistant housing and the second part (6) thereon without interrupting supply of electrical energy of said "not intrinsically safe" level via the power and energy transfer means to the first part,
said means including a flame-proof coupling system forming part of said connection arrangement (4) and comprising
at least one receptacle terminal element (53) located on said first part;
at least one plug or pin terminal element (38) located on said second part (6); and
means (46, 50, 51) defining a flame-proof gap in a said plug and receptacle arrangement for reception of the plug or pin terminal element upon connection with the receptacle terminal element.

35. The modular electrical system of claim 34, wherein said means for defining the flame-proof gap comprises
a block of material formed with a bore (50, 51), said bore having side walls of insulating material,
the receptacle element (53) being located interiorly of the bore; and
the plug or pin element (38) being dimensioned to slidingly, yet snugly, fit into said bore with a flame-proof sealing gap upon engagement of said plug or pin element with the receptacle element (53) located interiorly of the bore.

36. The modular electrical system of claim 35, wherein (FIGS. 6–10) both said parts (5, 6) of the plug-in and receptacle arrangement (4) include, each, a base body or block (37, 46) and terminal means (38, 53) secured on the respective base body or block;
wherein said first part (5) is formed with a bore (50, 51) and the terminal means includes a terminal element (53) located interiorly of said bore,
the terminal means further includes projecting plug or pin elements (38) secured to said second part (6); and
closure means (71, 81, 91, 97) are provided for closing off said bore (50, 51), said closure means closing the bore upon removal of the plug or pin elements (38) from the bore.

37. The modular electrical system of claim 34, wherein
at least two of said electrical subsystems further include connection means (7) coupled to electrical components (29) within said chamber for transfer exteriorly of said housing of electrical energy at levels which are "intrinsically safe" to permit individual removal of any selected subsystems and the respective housing without disturbing subsystems remaining in said frame, including electrical power supply and energy transfer to the remaining subsystems through respective plug and receptacle arrangements (4) at power levels which are "not intrinsically safe" as well as through said further separable connection means (7) which transfer power which transfer power at levels which are "intrinsically safe".

38. For use in an explosion-endangered location and environment,
a modular electrical system having
a frame (2, 8);
a plurality of electrical subsystems located on said frame, at least one of said electrical subsystems including
an explosion-resistant modular housing (3) defining a chamber (28) therein, and electrical components (29) located in said chamber, said housings, each, being selectively individually separable from said frame; and
electrical power supply and electrical energy transfer means (12', 62) for transferring electrical energy to said subsystems at energy levels which are "not intrinsically safe", and
comprising
individual plug and receptacle arrangements (4) having
a first connection part (5, 53) secured to the frame, and, each electrically connected to the power supply means (12', 62), and
a second connection part (6, 38) secured to the explosion-resistant housing (3) and electrically connected interiorly of the housing to said electrical components (29); and means for permitting individual separation and removal of any explosion-resistant housing and the second part (6) thereon without interrupting supply of electrical energy of said "not intrinsically safe" level via the power and energy transfer means to the first part, said means including at least a first terminal element (53) located on said first part;

at least a second terminal element (38) located on said second part and separably engageable with said first terminal element; and at least one switch (58, 67) of the explosion-safe type located on at least one (5) of the parts, and serially connected between said electrical power supply and energy transfer means (12', 62) and at least one (53) of the terminal elements (53), (38), said at least one switch including a switch operating element (59, 68) engaged upon engagement of said parts, and being connected to disconnect the terminal means connected to said switch, and opening or disconnecting a circuit thereto in advance of separation of said terminal means upon separation of said parts (5, 6) to prevent said terminal means from being under voltage during separation and hence to prevent arcing at said terminal means.

39. The modular electrical system of claim 38, wherein said at least one switch (58) is electrically located between the electrical power and energy transfer means (12', 62) and the first terminal element (53) located on said first part (5).

40. The modular electrical system of claim 38, wherein said electrical power supply and energy transfer means (12', 62) are capable of transferring electrical energy through said terminal elements (38, 53) at levels which are "not intrinsically safe";

and at least two of said electrical subsystems further include connection means (7) coupled to electrical components (29) within said chamber for transfer exteriorly of said housing of electrical energy at levels which are "intrinsically safe" to permit individual removal of any selected subsystems and the respective housing without disturbing subsystems remaining in said frame, including electrical power supply and energy transfer to the remaining subsystems through respective plug-in and receptacle arrangements (4) at power levels which are "not intrinsically safe" as well as through said further separable connection means (7) which transfer power which transfer power at levels which are "intrinsically safe".

41. The modular electrical system of claim 38, further including closure means (71, 81, 91, 97) for closing off said bore (50, 51), said closure means closing the bore upon removal of the plug or pin elements (38) from the bore.

42. The modular electrical system of claim 38, wherein (FIGS. 11, 12, 12A) said terminal means include a plurality of essentially independently springy or resiliently movable contact blades or strips (112).

43. The modular electrical system of claim 38, for combination with further separable connection means including a plug-in terminal strip (7) which is capable of transferring electrical energy only at levels which are "intrinsically safe".

* * * * *